(12) United States Patent
Menkhoff

(10) Patent No.: US 7,774,394 B2
(45) Date of Patent: Aug. 10, 2010

(54) EXPONENTIATED POLYPHASE DIGITAL FILTER

(75) Inventor: Andreas Menkhoff, Oberhaching (DE)

(73) Assignee: Infineon Technologies AG, Neubiberg (DE)

(*) Notice: Subject to any disclaimer, the term of this patent is extended or adjusted under 35 U.S.C. 154(b) by 1025 days.

(21) Appl. No.: 11/465,605

(22) Filed: Aug. 18, 2006

(65) Prior Publication Data

US 2008/0043889 A1 Feb. 21, 2008

(51) Int. Cl.
*G06F 17/17* (2006.01)
*F06F 17/10* (2006.01)
(52) U.S. Cl. ........................ 708/313; 708/316
(58) Field of Classification Search .......... 708/300–323
See application file for complete search history.

(56) References Cited

U.S. PATENT DOCUMENTS 4,570,235 A * 2/1986 Kerdoncuff et al. ......... 708/311
6,570,514 B1 * 5/2003 Velazquez .................. 341/118
2005/0075815 A1 * 4/2005 Webster et al. ............. 702/106

OTHER PUBLICATIONS

Gazsi, "Explicit formulas for Lattice Wave Digital Filters", IEEE Trans. Circuit and Systems, No. 1, pp. 68-88, Jan. 1985.

* cited by examiner

*Primary Examiner*—Tan V Mai
(74) *Attorney, Agent, or Firm*—Edell, Shapiro & Finnan, LLC

(57) ABSTRACT

The structure of a digital filter is provided through exponentiation of a polyphase digital filter. This exponentiation may be accomplished by determining an expression for the polyphase digital filter in terms of its polyphase components, and raising the expression for the polyphase digital filter to a power. The polyphase components are then arranged in a structure based on this exponentiated expression.

34 Claims, 8 Drawing Sheets

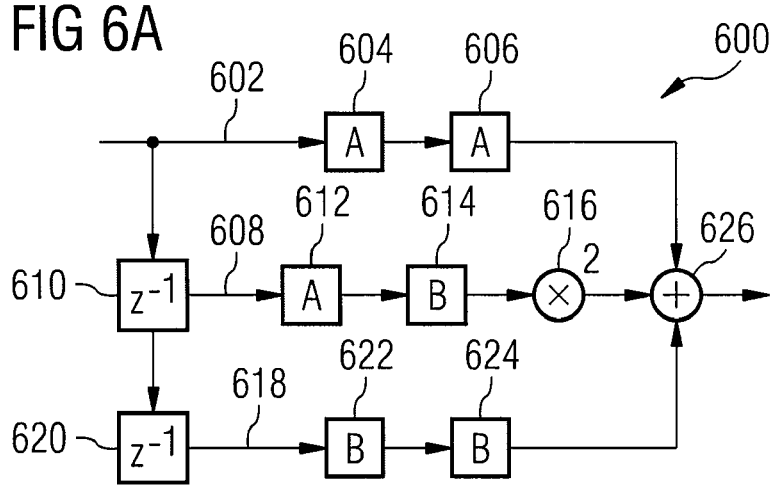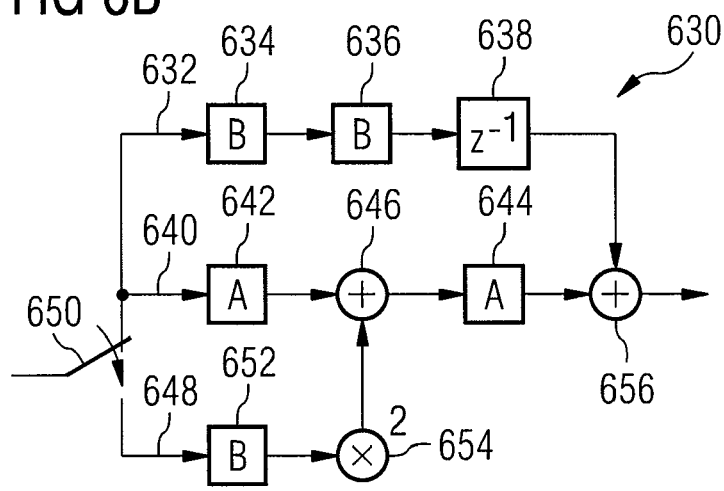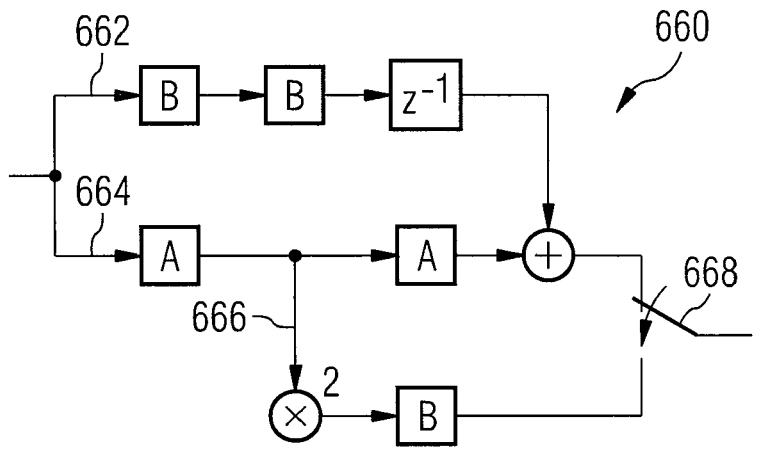

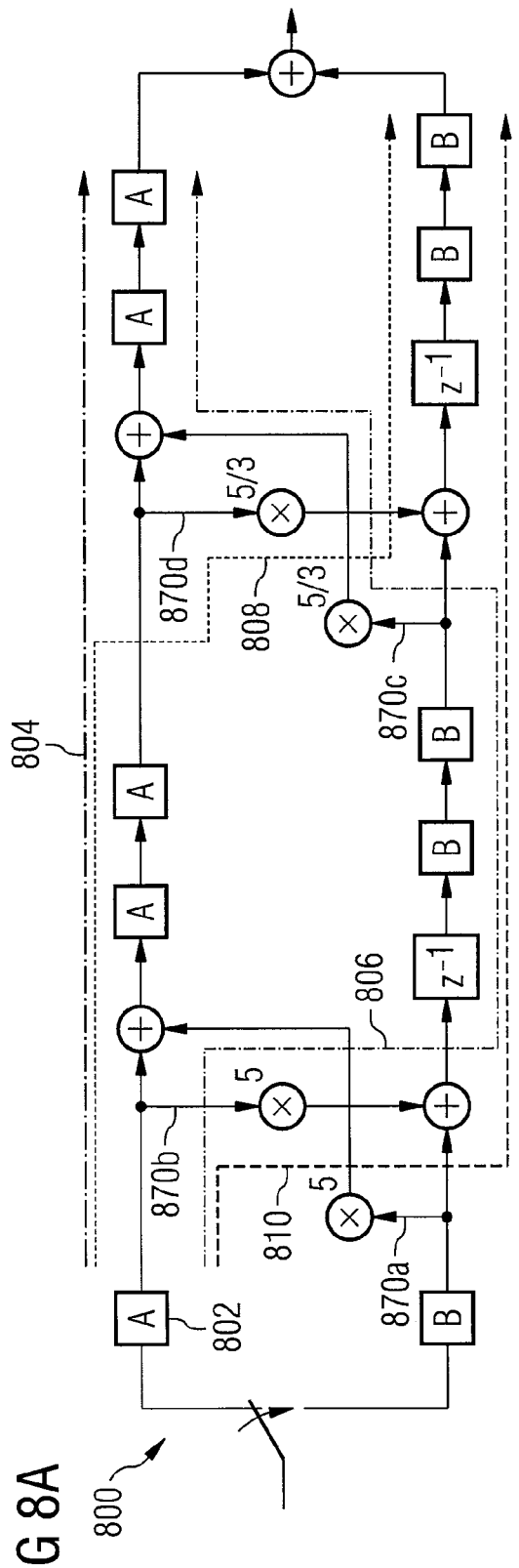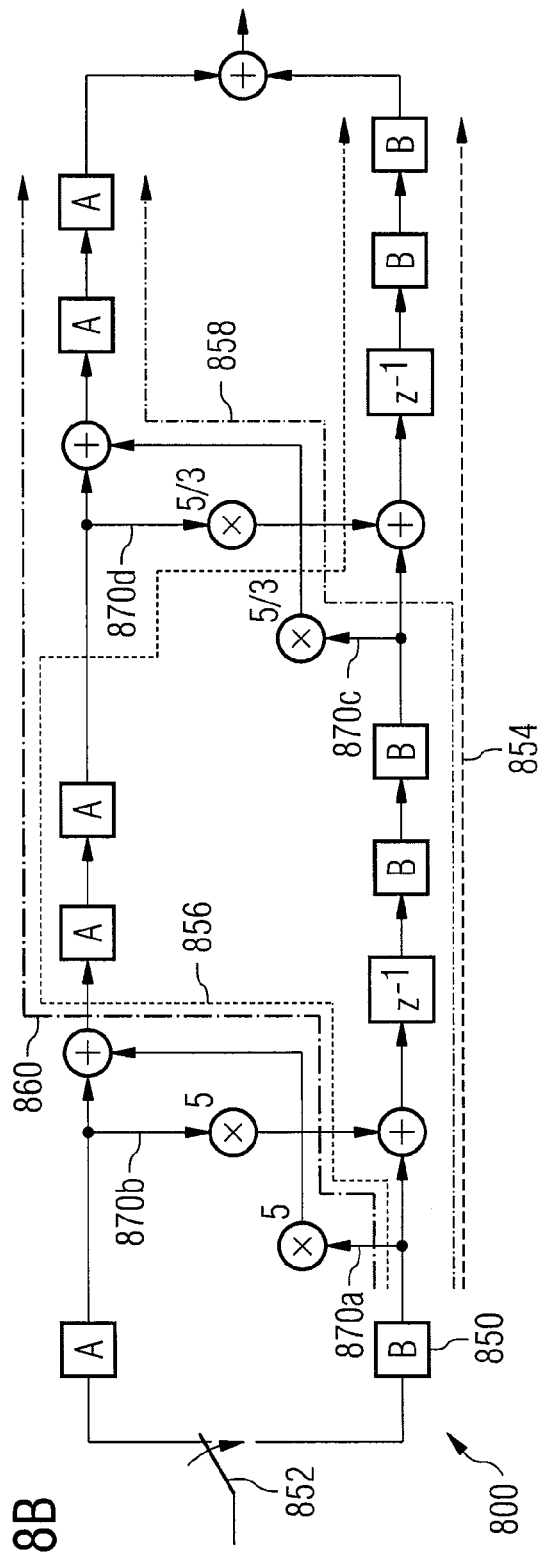
FIG 8A
FIG 8B

EXPONENTIATED POLYPHASE DIGITAL FILTER

TECHNICAL FIELD

The invention relates generally to digital filtering.

BACKGROUND

The increasing quality of digital transmission technology is placing greater demands on the requirements for digital filters. In particular, the requirements for stop band attenuation and the width of the transition region are becoming more challenging to meet. For example, in typical audio applications, filters with 100 dB stop band attenuation, and a transition region spanning 0.5 kHz or less are desired. Additionally, requirements that such filters operate at high speed, low power, and be as inexpensive as possible make digital filters that use as few operations as possible increasingly desirable. For these and other reasons, there is a need for the present invention as set forth in the following embodiments.

SUMMARY

According to one embodiment, a structure of a digital filter can be provided through exponentiation of a polyphase digital filter. This may be accomplished by determining an expression for the polyphase digital filter in terms of its polyphase components, and raising the expression for the polyphase digital filter to a power. The polyphase components may then be arranged in a structure based on this exponentiated expression.

These and other features of the invention will be better understood when taken in view of the following drawings and a detailed description.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIGS. 6A, 6B, and 6C show signal flow structures for an exponentiated polyphase digital filter, in accordance with an embodiment;

FIGS. 8A and 8B show a signal flow diagram of a two-branch polyphase digital filter raised to the fifth power, in accordance with an embodiment;

DETAILED DESCRIPTION

Figure 1:
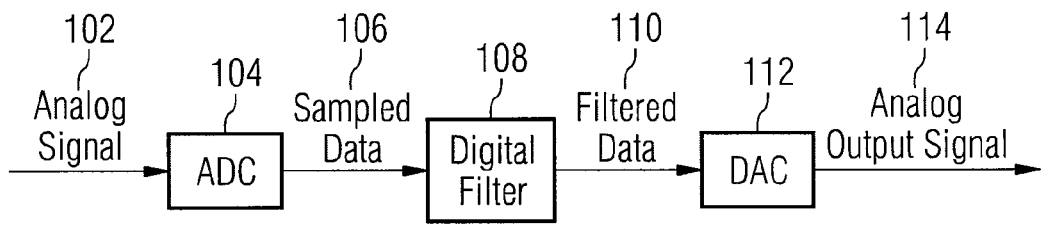
FIG. 1 shows a conventional application of a digital filter.

A digital filter is an electronic filter that performs a series of digital operations on a digital sampled signal. As shown in FIG. 1, in a typical application of a digital filter, an analog signal 102, such as an audio signal, is sampled, typically at regular time intervals, by an analog-to-digital converter 104, producing sampled data 106, which includes digital data representing the analog signal 102. The sampled data 106 may be referred to as the input signal of a digital filter 108. The digital filter 108, which may be implemented using special-purpose electronics, a programmable digital signal processor (DSP), or a programmable general purpose processor, performs one or more digital operations on the sampled data 106, to produce filtered data 110, which may be referred to as the output signal of the digital filter 108. The filtered data 110 may then be converted into an analog output signal 114, using a digital-to-analog converter 112. Alternatively, the filtered data 110 may be stored or subjected to further processing.

In general, digital filters, such as the digital filter 108, offer numerous advantages over analog filters, which operate entirely in the analog domain, and are constructed of networks of electronic components such as resistors, capacitors, and inductors. Digital filters can be designed to perform most any filtering operation that can be expressed as a mathematical algorithm, permitting them to perform filtering operations that would be difficult or even impossible for analog filters. Additionally, digital filters are more stable than analog filters, and are not subject to drift over time, or to temperature-based effects.

The digital values of the sampled data 106 may be represented as a sequence $x_0, x_1, x_2, x_3, x_4, \ldots, x_n$ where $x_0$ is the sampled value at time interval 0, $x_1$ is the sampled value at time interval 1, and so on. The filtered data 110, which is the output of the digital filter 108, may be represented as a sequence $y_0, y_1, y_2, y_3, \ldots, y_m$. The function that describes the operation of the digital filter 108 in transforming the sampled data 106 into the filtered data 110 may be referred to as the transfer function of the digital filter 108. The operation of a digital filter may also be described in the time domain by a difference equation.

For example, a difference equation for an averaging filter, smoothing high frequency components of an input signal by producing an average of the past three values, may be expressed as:

$$y_i = (x_i + x_{i-1} + x_{i-2})/3 \qquad \text{Eq. 1}$$

Because each value of the output (y) depends on the current and past two values of the input (x), this may be referred to as a second order digital filter. As a further example, a filter in which the output value depends on the current input value and five past input values would be referred to as a fifth order filter. Additionally, because the values of the output sequence depend only on current or previous values of the input sequence (and do not depend on previous values of the output sequence), this example filter is a non-recursive, or finite impulse response (FIR) digital filter. The general form of the difference equation for an $n^{th}$ order linear time-invariant (LTI) FIR filter is:

$$y_i = \sum_{k=0}^{n} \beta_k x_{i-k} \qquad \text{Eq. 2}$$

Where, $\beta_0, \beta_1, \ldots, \beta_n$, are constants that are referred to as filter coefficients.

By introducing a delay operator, z, such that $x_{i-1} = z^{-1} X(z)$, $x_{i-2} = z^{-2} X(z)$, and so on, the expression for the example filter given in Eq. 1 can be rewritten as:

$$Y(z) = \frac{1}{3}(1 + z^{-1} + z^{-2}) X(z) \qquad \text{Eq. 3}$$

It will be understood by one of ordinary skill in the relevant arts that use of this "delay operator" is a simplified way of illustrating an application to digital filters of a more general mathematical function known as a Z-transform. This simplification is intended to clarify the operation of digital filters according the embodiments.

The expression shown in Eq. 2 can be rewritten as:

$$H(z) = \frac{Y(z)}{X(z)} = \frac{1}{3} + \frac{1}{3} z^{-1} + \frac{1}{3} z^{-2} \qquad \text{Eq. 4}$$

Where $H(z)$ is the transfer function for the filter. In general, the transfer function for an $n^{th}$ order FIR can be written as:

$$H(z) = \sum_{k=0}^{n} \beta_k z^{-k} \qquad \text{Eq. 5}$$

Figure 2A:
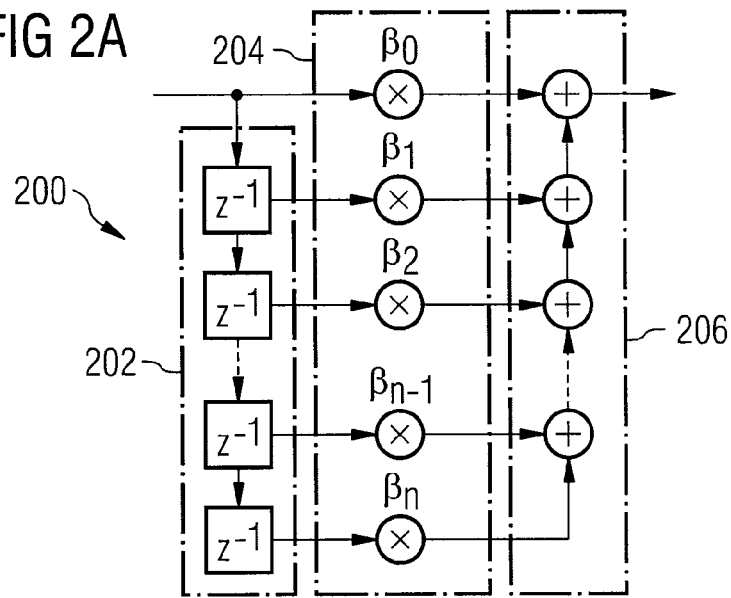
FIGS. 2A and 2B are signal flow diagrams of a conventional finite impulse response filter (FIR) and infinite impulse response filter (IIR), respectively.

FIG. 2A shows a signal flow diagram of an $n^{th}$ order FIR, such as is represented by the transfer function in Eq. 5. The filter 200 includes n delay elements 202, each of which delays an input to the filter 200 by one sample. The filter 200 also includes n+1 multiplication operations 204, which multiply the current and delayed inputs by the filter coefficients, and n addition operations 206, which compute the sum of the current and delayed inputs, after they have been multiplied by the filter coefficients. It will be understood that there are other possible signal flows that would, in theory, yield the same result as the signal flow diagram shown in FIG. 2A.

For some digital filters, the output value depends on the current input value, previous input values, and previous output values. Such a filter can be referred to as a recursive filter, or an infinite impulse response (IIR) filter, since the response of such a filter to a single impulse signal can, theoretically, continue forever.

The general form of the difference equation of an IIR filter is:

$$y_i = \sum_{k=0}^{n} \beta_k x_{i-k} - \sum_{k=1}^{m} \alpha_k y_{i-k} \qquad \text{Eq. 6}$$

Where the $\alpha_k$ and $\beta_k$ are filter coefficients. As can be seen from this expression, the difference equation for an FIR, as given in Eq. 2, is the same as the difference equation for an IIR given in Eq. 6, in which all of the $\alpha_k$ are zero. The order of an IIR is the greater of m and n. For example, a filter that relies on the current and last four inputs (i.e., n=4) and the last seven outputs (i.e., m=7) would be referred to as a seventh order filter. In practice, many digital filters depend on the same number of past inputs and past outputs.

The Z transform of the difference equation given in Eq. 6 gives:

$$Y(z) = \sum_{k=0}^{n} \beta_k z^{-k} X(z) - \sum_{k=1}^{m} \alpha_k z^{-k} Y(z) \qquad \text{Eq. 7}$$

Grouping the terms dependent on the output together on the left-hand side of the equation and factoring $X(z)$ and $Y(z)$ out of the summations yields:

$$Y(z)\left(1 + \sum_{k=1}^{m} \alpha_k z^{-k}\right) = X(z) \sum_{k=0}^{n} \beta_k z^{-k} \qquad \text{Eq. 8}$$

Which can be rewritten to give the general form of the transfer function for a IIR filter as:

$$H(z) = \frac{Y(z)}{X(z)} = \frac{\sum_{k=0}^{n} \beta_k z^{-k}}{1 + \sum_{k=1}^{m} \alpha_k z^{-k}} \qquad \text{Eq. 9}$$

As with the general forms of the difference equations, the general form of the transfer function of an FIR, as given in Eq. 5, is the same as the transfer function for an IIR given in Eq. 9, in which all of the $\alpha_k$ are zero.

Figure 2B:
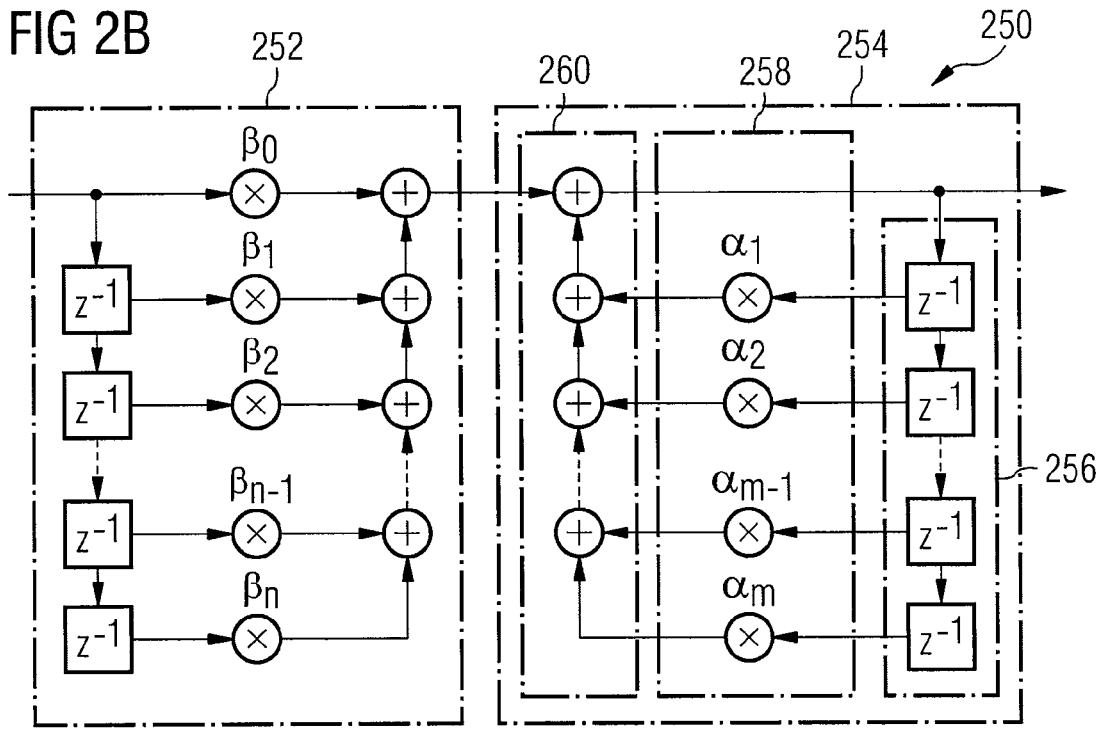

FIG. 2B shows a signal flow diagram of an IIR, such as is represented by the transfer function in Eq. 9. As can bee seen, an IIR filter 250 includes a left half 252 that is identical to the graphical representation of the FIR filter 200 shown in FIG. 2A. Additionally, the IIR filter 250 includes a right half 254 that computes the portion of the filter that depends on feedback of previous outputs of the filter. Thus, the IIR filter 250 includes an additional m delay elements 256, each of which delays an output of the IIR filter 250 by one time interval. The IIR filter 250 also includes m multiplication operations 258, which multiply the delayed outputs by appropriate filter coefficients, and m addition operations 260, which compute the sum of the delayed outputs after they have been multiplied by the filter coefficients, and add the result to that of the left half 252, to produce outputs. It will be understood that there are other possible signal flows that would, in theory, yield the same result as the signal flow diagram shown in FIG. 2B.

Figure 3A:
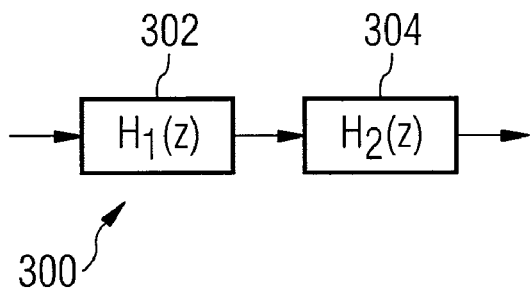
FIGS. 3A and 3B show filters combined in series and in parallel, respectively.

The transfer functions of filters, such as are given above in Eq. 5 and Eq. 9 have some convenient properties when filters are operated in series or parallel combinations. For a series combination filter, such as the series combination filter 300 shown in FIG. 3A, in which the output of a first filter 302, having a transfer function $H_1(z)$, serves as the input to a second filter 304, having a transfer function $H_2(z)$, the overall transfer function of the combination can be expressed as:

$$H(z)=H_1(z)\cdot H_2(z).\qquad\text{Eq. 10}$$

Additionally, such series combinations are commutative, so the overall transfer function H(z) is the same, regardless of the order in which the filters are arranged in series.

Exponentiation of a filter indicates that the same filter is repeatedly cascaded in series, with the output of one application of the filter being used as the input to the next. For example, the transfer function for a filter raised to the fourth power can be expressed as:

$$H(z)^4=H(z)\cdot H(z)\cdot H(z)\cdot H(z)\qquad\text{Eq. 11}$$

Figure 3B:
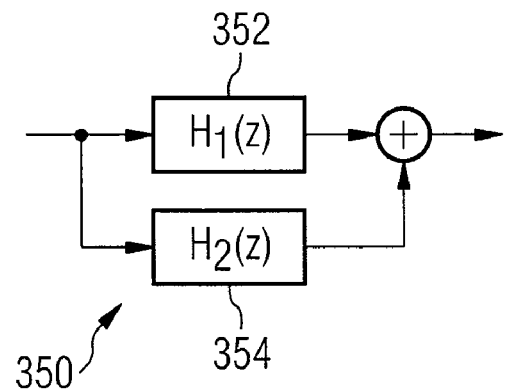

In a parallel combination, such as the parallel combination filter 350, shown in FIG. 3B, the overall output is the sum of the output of a first filter 352, having a transfer function $H_1(z)$ and the output of a second filter 354, having a transfer function $H_2(z)$, which operates in parallel with the first filter 352. The overall transfer function for such a parallel combination is the sum of the transfer functions of the filters:

$$H(z)=H_1(z)+H_2(z).\qquad\text{Eq. 12}$$

One useful way in which a filter having the form of a parallel combination filter may be derived is through polyphase decomposition. Polyphase decomposition is a process in which a filter is split into two or more sub-filters, each of the sub-filters having a common delay factor. To illustrate this process, the polyphase decomposition of an example fifth order FIR filter will be described. The transfer function of a fifth order FIR filter can be expressed as:

$$H(z)=\beta_0+\beta_1 z^{-1}+\beta_2 z^{-2}+\beta_3 z^{-3}+\beta_4 z^{-4}+\beta_5 z^{-5}\qquad\text{Eq. 13}$$

This can be rewritten as the sum of two parts, one of which contains the even-powered terms of the transfer function, and the other of which contains the odd-powered terms. The resulting expressions is:

$$H(z)=(\beta_0+\beta_2 z^{-2}+\beta_4 z^{-4})+(\beta_1 z^{-1}+\beta_3 z^{-3}+\beta_5 z^{-5})\qquad\text{Eq. 14}$$

Factoring out $z^{-1}$ from the second term yields:

$$H(z)=(\beta_0+\beta_2 z^{-2}+\beta_4 z^{-4})+z^{-1}(\beta_1+\beta_3 z^{-2}+\beta_5 z^{-4})\qquad\text{Eq. 15}$$

By using the notation:

$$A=\beta_0+\beta_2 z^{-2}+\beta_4 z^{-4}$$

$$B=\beta_1+\beta_3 z^{-2}+\beta_5 z^{-4}\qquad\text{Eq. 16}$$

The transfer function for the filter can be expressed as:

$$H(z)=A+z^{-1}B\qquad\text{Eq. 17}$$

Where A and B are referred to as polyphase components of the filter.

Figure 4:
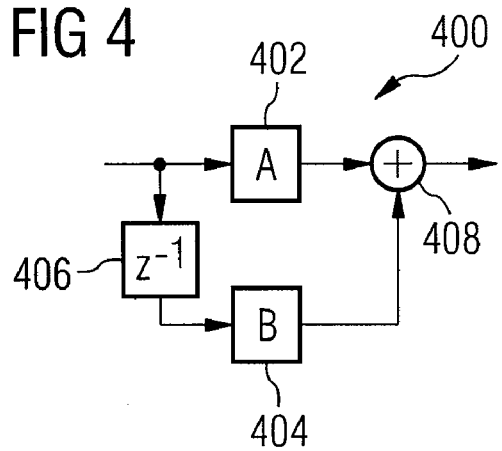
FIGS. 4 shows a signal flow diagram of a polyphase filter.

FIG. 4 shows a signal flow diagram for the filter of Eq. 17. The filter 400 is a parallel combination filter in which a first polyphase component 402 is computed on a first branch of the filter 400, and a second polyphase component 404 is computed on a second branch of the filter 400. A delay 406 imposes a one sample delay on signals prior to applying the second polyphase component 404. The outputs of the first polyphase component 402 and second polyphase component 404 are summed by an adder 408 to provide the output of the filter 400, corresponding to the transfer function given in Eq. 17.

While the example described above gives a two-branch polyphase decomposition, it will be understood that similar polyphase decompositions may be used to split a digital filter into an arbitrary number of polyphase components. For example, a three-branch polyphase decomposition of the fifth order FIR given in Eq. 13 would be:

$$H(z)=A+z^{-1}B+z^{-2}C\qquad\text{Eq. 18}$$

Where:

$$A=\beta_0+\beta_3 z^{-3}$$

$$B=\beta_1+\beta_4 z^{-3}$$

$$C=\beta_2+\beta_5 z^{-3}\qquad\text{Eq. 19}$$

It will further be understood that while the example described above shows the polyphase decomposition of an FIR digital filter, polyphase decompositions may also be derived for IIR filters.

Typical applications for polyphase decomposition include the design of filters for interpolation and decimation. In interpolation, the goal is to increase the sample rate of the signal. This is typically accomplished by adding zero-valued samples between input samples. For example, to upsample by a factor of two (i.e., the output signal will have twice the sample rate of the input signal), one zero-valued sample is added between each pair of input samples. In general, to upsample by a factor of L, L-1 zero-valued samples are added between each pair of input samples. Unfortunately, these zero-valued samples result in the addition of undesired spectral images at multiples of the original sampling rate. A filter is used to remove these unwanted spectral images. Advantageously, by using a polyphase filter for interpolation, the parallel branches of the filter need only run at a fraction of the output rate. For interpolation which increases the sample rate by a factor of two, for example, a two-branch polyphase decomposition can be used to run each of the branches at half of the output rate.

Figure 5A:
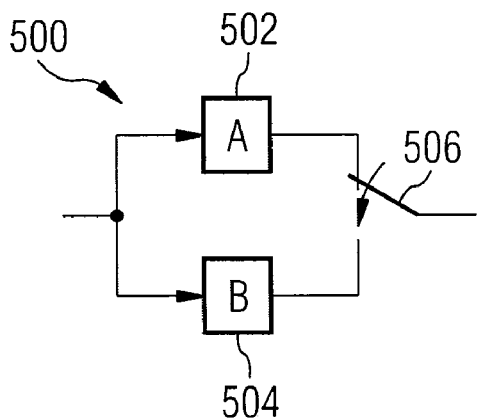
FIGS. 5A and 5B show polyphase filters arranged for interpolation and decimation, respectively.

FIG. 5A shows a polyphase filter 500 arranged for interpolation by a factor of two. The filter 500 includes a first polyphase component 502, a second polyphase component 504, and a switch 506. The switch 506 effectively adds a one sample delay (substituting for a $z^{-1}$ block) to the "bottom" branch of the filter 500, which includes the second polyphase component 504. The switch 506 also causes the output of the filter 500 to run at twice the speed of the branches of the filter 500, which run at the input sample rate. In general, in digital filters configured for interpolation or decimation, a switch, such as the switch 506, can be used to introduce delays.

For decimation, the goal is to reduce the sample rate. This is done by effectively removing input samples. For example, removing every other input sample would reduce the sample rate by a factor of two. Generally, a low pass filter is applied before samples are removed, to prevent aliasing. This low pass filter may be used to enforce the Nyquist criteria (i.e., the sample rate must be at least twice the frequency of the highest frequency in the sample) at the reduced sample rate. For example, if decimation is being used to reduce the sample rate from 44 KHz to 22 KHz, a low pass filter that removes frequency components above 11 KHz would typically be used to prevent aliasing.

The ratio of the input rate to the output rate is referred to as the decimation factor, M. For example, if the input rate is twice the output rate, the decimation factor would be 2. Using decimation to reduce the sample rate of a signal is desirable when the extra samples are not needed for high frequency components in the signal. Decreasing the sample rate by a factor of M will typically reduce the amount of computation that must be performed in signal processing applications by more than a factor of M.

Advantageously, by using a polyphase filter for decimation, the branches of the filter may run at the output sample rate, which is a factor of M lower than the input sample rate. Thus, for a polyphase filter used for decimating by a factor of two, the parallel branches of the filter would run at half the input sample rate.

Figure 5B:
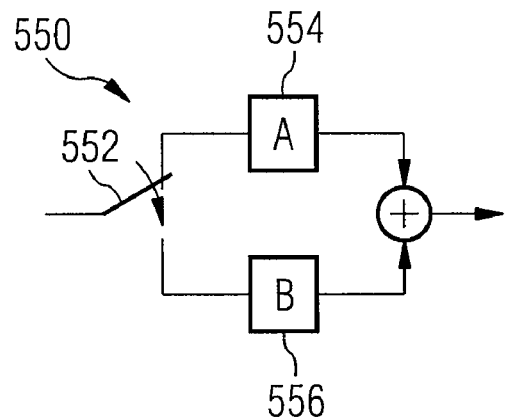

FIG. 5B shows a polyphase filter 550 arranged for decimation by a factor of two. The filter 550 includes a switch 552, a first polyphase component 554, and a second polyphase component 556. The switch 552 effectively adds a one sample delay to the "bottom" branch of the filter 500, which includes the second polyphase component 556. Due to its position at the front of the signal path, the switch 552 also cuts the input sample rate in half, permitting the branches and output of the filter 550 to operate at half the speed of the input sample rate.

Polyphase implementations of filters for decimation and interpolation by a factor of two are widely used in a variety of signal processing applications. Such interpolation and decimation filters may be implemented using polyphase decompositions of FIR or IIR filters, depending on the desired characteristics of the filter.

In accordance with the embodiments, a digital filter having desirable characteristics, such as a high stop band attenuation and a narrow transition band may be achieved, as will be demonstrated in further detail below, through use of an exponentiated polyphase filter. Advantageously, the polyphase filter that is exponentiated may be of relatively low order, and may have filter coefficients that are computationally inexpensive to use in multiplication operations, while still achieving good results, due to exponentiation. Such exponentiated polyphase filters may require fewer operations than conventional filters, reducing the complexity and power consumption and increasing the speed of digital filters.

According to an embodiment, the transfer function of an exponentiated polyphase filter may be expressed as a polynomial, the terms of which are made up of combinations of the polyphase components. For example, raising the transfer function of a two-branch polyphase filter to the second power can be expressed as:

$$H(z)^2 = (A + Bz^{-1})^2 = A^2 + 2ABz^{-1} + B^2 z^{-2}.$$  Eq. 20

In accordance with an embodiment, this polynomial is then used to structure the digital filter, so that each of the polyphase components, A and B, as well as the delays, are interconnected so that they are applied an appropriate number of times, and the results summed. Using the properties of transfer functions discussed above, that multiplication represents filters applied in sequence, and addition represents filters applied in parallel, a very direct approach to using the expression given in Eq. 20 to provide a structure for a filter is shown in FIG. 6A.

As shown in FIG. 6A, the filter 600, includes a parallel branch for each term of the polynomial of Eq. 20. In a first branch 602, the sub-filter for the polyphase component A is applied twice in series: once in A-filter block 604, and a second time in A-filter block 606. This yields $A^2$ as the result of applying the first branch 602. A delay 610 is applied prior to a second branch 608 of the filter 600. The second branch 608 includes an A-filter block 612, a B-filter block 614, and a multiplier 616, which multiplies by 2. Thus, the second branch 608 yields $2ABz^{-1}$. A second delay 620 is applied prior to the third branch 618, providing a total delay on this branch of $z^{-2}$. The third branch 618 includes a first B-filter block 622 and a second B-filter block 624, yielding $B^2 z^{-2}$. The results from the three branches are summed by an adder 626, to yield the overall transfer function for the filter: $A^2 + 2ABz^{-1} + B^2 z^{-2}$.

While the filter shown in FIG. 6A provides a direct way of structuring a filter based on the polynomial expansion obtained from exponentiation of a polyphase filter, it is not necessarily an efficient means of implementing the filter. In accordance with an embodiment, the structure of the filter may be optimized, by "sharing" some of the polyphase components between branches of the filter.

FIG. 6B shows the structure of a more optimized version of the filter derived from Eq. 20, in this instance arranged for decimation, so the branches run at half the input sample rate. As can be seen, the filter 630 has one fewer blocks computing a polyphase component than the filter 600 of FIG. 6A. While this savings may seem small, as will be seen in further examples, optimization due to sharing of polyphase components and delay blocks becomes more substantial as the exponentiation power is increased. Additionally, in some embodiments, each of the polyphase components may represent a complex sub-filter, so that removal of even one such block from the filter structure may represent a significant savings.

In the filter 630 of FIG. 6B, a path 632 uses a first B-filter block 634 and a second B-filter block 636, as well as a delay 638, which provides a delay of $z^{-2}$ Thus, the path 632 computes $B^2 z^{-2}$. It should be noted that although the delay 638 is marked in FIG. 6B as providing a delay of $z^{-1}$, because it is on a branch of the polyphase filter 630 that is operating at half the speed of the input stream, the effective delay provided by the delay 638 will be $z^{-2}$.

A second path 640 includes a first A-filter block 642 and a second A-filter block 644. An adder 646 is also present in the second path 640 (and a third path 648). Because at any given sample time, one of the two inputs to the adder 646 will be zero, the adder 646 serves to combine a portion of the third path 648 with a portion of the second path 640, and does not change the output of the second path 640. The second path 640 computes $A^2$. A third path 648 is subject to a delay of $z^{-1}$, due to the presence of a switch 650. The third path 648 includes a B-filter block 652, a multiplier 654, which multiplies by 2, and the second A-filter block 644, shared with the second path 640. Thus, the third path 648 computes $2ABz^{-1}$. An adder 656 combines the results of the three paths 632, 640, and 648 to provide the output of the filter 630.

An alternative design for a similar filter, this time configured for interpolation, is shown in FIG. 6C. As can be seen, the filter 660 includes paths 662, 664, and 666 that are similar to the paths in the filter 630 of FIG. 6B. In the filter 660, a switch 668 is placed at the end of the filter paths, providing an output that is at the twice the sample rate of the input (and paths 662, 664, and 666). As in previous examples, the switch 668 also adds a delay of $z^{-1}$ to the path 666. Also, as in the embodiment shown in FIG. 6B, because the branches of the polyphase filter 660 run at half the output speed, the $z^{-1}$ blocks on those branches cause an effective delay of $z^{-2}$. In later examples, generally only a single configuration, either for decimation or interpolation, will be shown. It will be understood that in each case, either configuration could be derived from the polynomial expansion of the transfer function of an exponentiated polyphase filter, in accordance with an embodiment.

Figure 7:
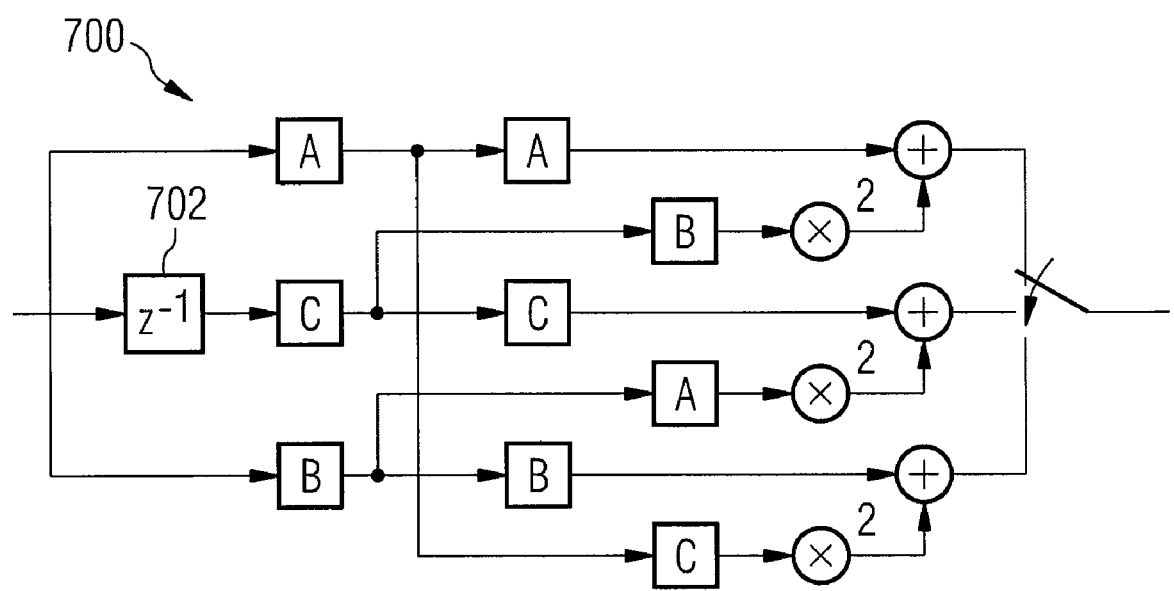
FIG. 7 shows a signal flow diagram of an exponentiated three-branch polyphase digital filter, in accordance with an embodiment.

It will further be understood that although most of the examples shown involve exponentiation of filters having two polyphase components, similar methods may be used with polyphase filters having more than two polyphase components. For example, FIG. 7 shows a filter derived from the polynomial expansion of a polyphase filter having three polyphase components, raised to the second power. In this case, the exponentiation of transfer function can be expressed as:

$$H(z)^2 = (A + Bz^{-1} + Cz^{-2})^2 = A^2 + 2ABz^{-1} + B^2z^{-2} + 2ACz^{-2} + 2BCz^{-3} + C^2z^{-4}$$  Eq. 21

As can be seen, there are signal six paths through the signal flow diagram of the filter 700 (in this case, arranged for interpolation) shown in FIG. 7, each of which computes one of the terms of the polynomial given in Eq. 21. It should be noted that since the branches of this filter run at one-third of the output rate, the delay 702 of $z^{-1}$ causes an effective delay of $z^{-3}$. It will be understood that the structure of the filter shown in FIG. 7 is just one possible structure for a filter that could be derived from Eq. 21, and that other possible structures may be used.

Referring now to FIGS. 8A and 8B, a further example of a filter derived from the polynomial expansion of an exponentiation of a polyphase filter is described. In the filter shown in FIGS. 8A and 8B, a polyphase filter having two polyphase components has been raised to the fifth power. An expression for this is given as:

$$H(z)^5 = (A + Bz^{-1})^5 = A^5 + 10A^3B^2z^{-2} + 5AB^4z^{-4} + B^5z^{-5} + 10A^2B^3z^{-3} + 5A^4Bz^{-1}$$  Eq. 22

To simplify the creation of a filter structure for this expression, A can be factored out of the first, second, and third terms of this expression, and $Bz^{-1}$ out of the fourth, fifth, and sixth. This yields:

$$A(A^4 + 10A^2B^2z^{-2} + 5B^4z^{-4}) + Bz^{-1}(B^4z^{-4} + 10A^2B^2z^{-2} + 5A^4)$$  Eq. 23

By factoring out A and $Bz^{-1}$, leaving two similar sets of terms, the structure of the filter can be simplified, and many of the blocks can be shared, as seen in the signal flow diagram of FIG. 8A, where the filter 800 (arranged for decimation) includes an A-filter block 802 prior to a "top" set of paths, representing the three terms from which A has been factored out. A first "top" path 804, results in calculation of $A^4$, which yields the $A^5$ term when the factor of A is multiplied back in. A second "top" path 806 and third "top" path 808 compute $(25/3)A^2B^2z^{-2}$ and $(5/3)A^2B^2z^{-2}$, respectively, yielding $10A^2B^2z^{-2}$ when they are summed, and $10A^3B^2z^{-2}$ when the factor of A is multiplied back in. A fourth "top" path 810 computes $5B^4z^{-4}$, which provides $5AB^4z^{-4}$ when the common factor of A is multiplied in.

In FIG. 8B, the same filter 800 is shown, highlighting the "bottom" paths. A B-filter block 850 is positioned ahead of these paths, and provides, in combination with a switch 852, a factor of $Bz^{-1}$. A first "bottom" path 854 computes $B^4z^{-4}$, yielding $B^5z^{-5}$ when multiplied by the factor of $Bz^{-1}$ that applies to all of the "bottom" paths. A second "bottom" path 856 and third "bottom" path 858 compute $(25/3)A^2B^2z^{-2}$ and $(5/3)A^2B^2z^{-2}$, respectively, providing $10A^2B^3z^{-3}$ when they are summed and multiplied by the common factor of $Bz^{-1}$. Finally, a fourth "bottom" path 860 computes $5A^4$, yielding $5A^4Bz^{-1}$.

As can be seen, the filter 800 includes crossover paths, 870a-870d that create numerous paths through the signal flow diagram of FIGS. 8A and 8B, and facilitate the sharing of many of the blocks in the filter 800. A straightforward translation of the expression given in Eq. 22, using no such crossover paths to share portions of the filter, would require fifteen A-filter blocks, and fifteen B-filter blocks, rather than the five A-filter blocks and five B-filter blocks that are used in the filter 800.

An exponentiated polyphase filter, such as the filter 800, may be referred to as "canonical" if it uses a number of A-filter blocks and B-filter blocks that is equal to the power to which the polyphase filter has been raised. Thus, for a polyphase filter that has been raised to the fifth power, a canonical structure for the filter would use five A-filter blocks and five B-filter blocks, such as are used in the filter 800.

Figures 9A, 9B:
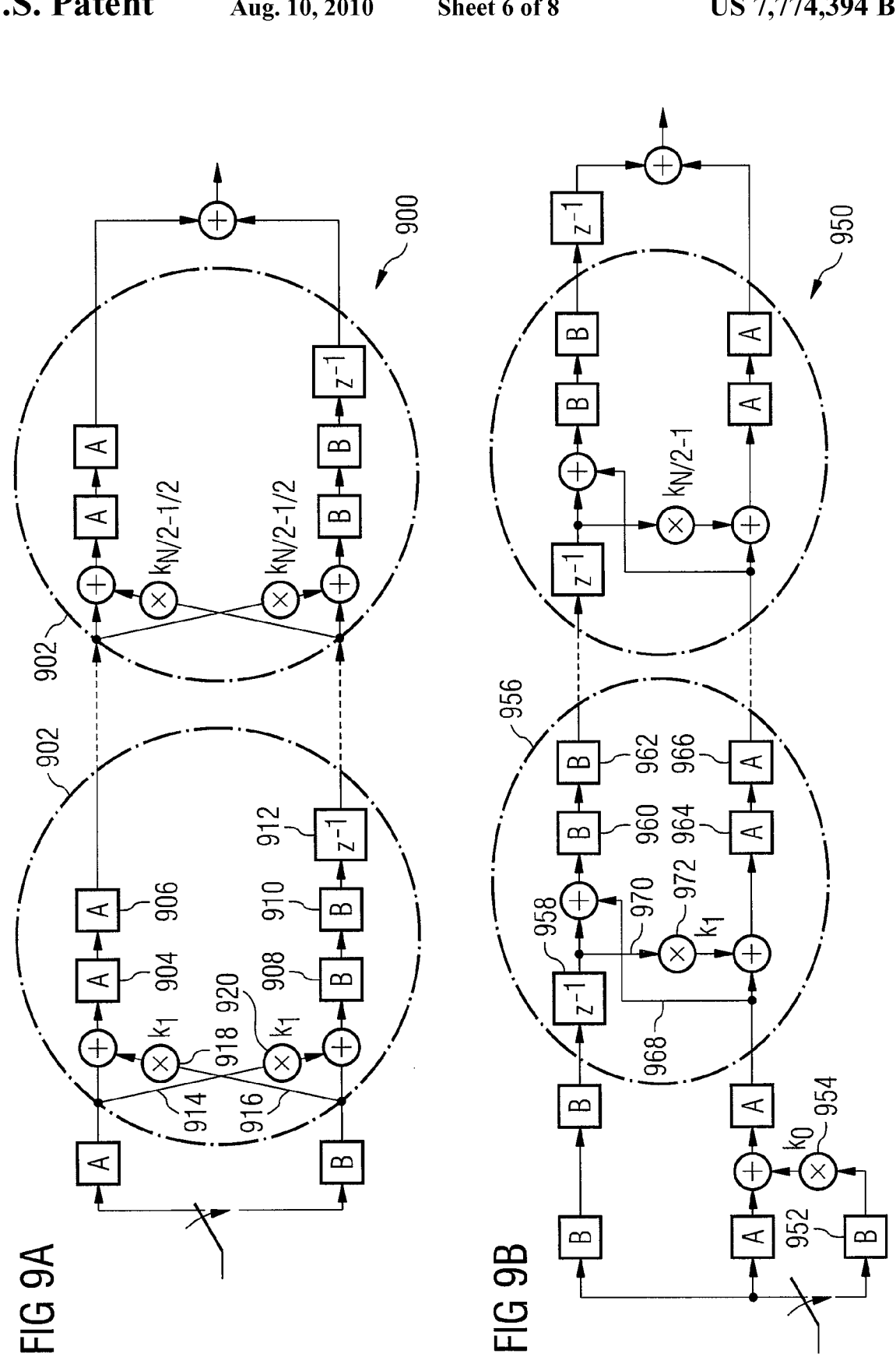
FIGS. 9A and 9B show signal flow diagrams of exponentiated polyphase digital filters using repeatable filter sections, in accordance with embodiments.

A canonical structure for any two-branch polyphase filter that is raised to an odd power is shown in FIG. 9A. The filter 900 (which is, in this case, configured for decimation) includes one or more repetitions of a filter section 902, each using a different exponentiation coefficient $k_1$-$k_{N/2-1/2}$, where N is the power to which the filter is being raised. Computation of these coefficients will be detailed below. For each repetition of the filter section 902, the power to which the two-branch polyphase filter is raised is increased by two.

The filter section 902 includes two A-filter blocks 904 and 906, two B-filter blocks 908 and 910, and a delay 912, which applies a delay of $z^{-2}$ (due to the branches running at the low rate, as in previous examples). Additionally, the filter section 902 includes crossover paths 914 and 916, which include multipliers 918 and 920, respectively. The multipliers 918 and 920 multiply the signal by an exponentiation coefficient, depending on the repetition of the filter section 902. The exponentiation coefficient $k_1$, is used in the first repetition of the filter section 902, $k_2$ on the second, and so on.

Table 1 gives the values for the exponentiation coefficients $k_1$-$k_{N/2-1/2}$ for two-branch polyphase filters raised to the third through ninth power.

TABLE 1

|        | $k_1$ | $k_2$ | $k_3$ | $k_4$ | $k_5$ |
|--------|-------|-------|-------|-------|-------|
| N = 3  | 3     |       |       |       |       |
| N = 5  | 5     | 5/3   |       |       |       |
| N = 7  | 7     | 7/3   | 7/5   |       |       |
| N = 9  | 9     | 3     | 9/5   | 9/7   |       |
| N = 11 | 11    | 11/3  | 11/5  | 11/7  | 11/9  |

In general, for two-branch polyphase filters that are raised to an odd power, the exponentiation coefficients $k_1$-$k_{N/2-1/2}$ are calculated according to the following formula:

$$k_i = \frac{N}{2i-1}$$  Eq. 24

Where N is the power to which the 2-branch polyphase filter is being raised, and i varies from 1 to (N-1)/2.

FIG. 9B shows a generalized structure for a two-branch polyphase filter raised to an even power, in accordance with an embodiment. The structure of the filter 950 is not quite canonical, since one additional B-filter block 952 is used, along with a multiplier 954, which multiplies by an exponentiation coefficient $k_0$. The filter 950, which is arranged in this instance for decimation, includes zero or more repetitions of a filter section 956, each using a different exponentiation coefficient $k_1$-$k_{N/2-1}$, where N is the power to which the filter is being raised. Without any repetitions of the filter section 956, the filter is raised to the second power. For each repetition of the filter section 956, the power to which the two-branch polyphase filter is raised is increased by two.

The filter section 956 includes a delay 958, which applies a delay of $z^{-2}$ (due to the branches running at the low rate), as well as two B-filter blocks 960 and 962, and two A-filter blocks 964 and 966. Additionally, the filter section 956 includes crossover paths 968 and 970. The crossover path 970 includes a multiplier 972, which multiplies the signal by an exponentiation coefficient, depending on the repetition of the filter section 956. The exponentiation coefficient $k_1$ is used in the first repetition of the filter section 956, $k_2$ on the second, and so on.

Table 2 gives the values for the exponentiation coefficients $k_0$-$k_{N/2-1}$ for two-branch polyphase filters raised to even powers for the second through twelfth power.

TABLE 2

|        | $k_0$ | $k_1$ | $k_2$  | $k_3$  | $k_4$  | $k_5$ |
|--------|-------|-------|--------|--------|--------|-------|
| N = 2  | 2     |       |        |        |        |       |
| N = 4  | 4     | 5     |        |        |        |       |
| N = 6  | 6     | 35/3  | 7/3    |        |        |       |
| N = 8  | 8     | 21    | 21/5   | 9/5    |        |       |
| N = 10 | 10    | 33    | 33/5   | 99/35  | 11/7   |       |
| N = 12 | 12    | 143/3 | 143/15 | 143/35 | 143/63 | 13/9  |

In general, for two-branch polyphase filters that are raised to an even power, the exponentiation coefficients $k_0$-$k_{N/2-1}$ are calculated according to the following formula:

$$k_i = \begin{cases} N & i = 0 \\ \frac{(N-1)(N+1)}{(2i-1)(2i+1)} & i = 1 \ldots \frac{N}{2} - 1 \end{cases} \quad \text{Eq. 25}$$

Where N is the power to which the 2-branch polyphase filter is being raised.

Figure 10A:
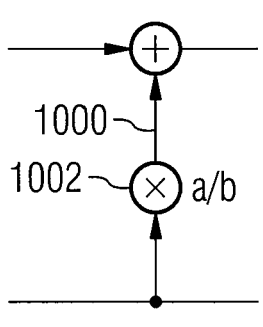
FIGS. 10A, 10B, and 10C show alternative structures for multiplying by a fraction in a crossover branch of a polyphase filter, in accordance with an embodiment.
Figure 10B:
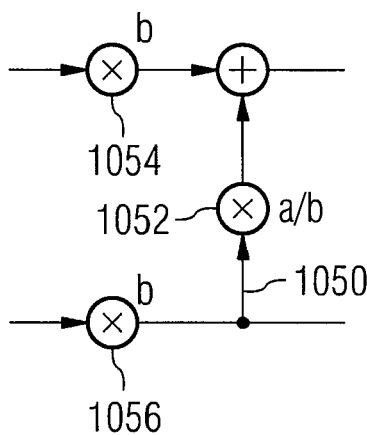
Figure 10C:
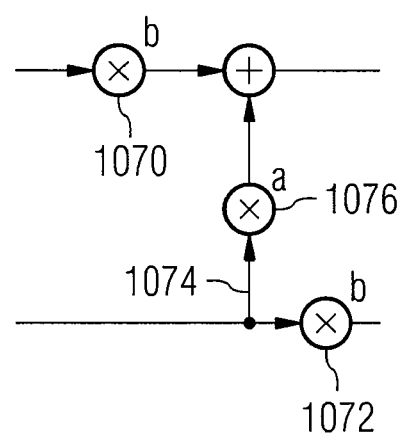

It should be noted that where multiplication by a fraction is required, the filter can be rearranged to perform multiplications by the numerator and denominator of the fraction, which may be less expensive computationally than multiplying by the fractional value. For example, FIG. 10A shows a crossover branch 1000 that includes a multiplier 1002 that multiplies by a fraction a/b. In FIG. 10B, the filter is multiplied by b, through use of multipliers 1054 and 1056 located on upper and lower branches of the filter, respectively, while the multiplier 1052 on the crossover branch 1050 multiplies by a/b. In FIG. 10C, multiplication by the fraction a/b is simplified to multiplication by a by using a multiplier 1070 that multiplies by b on the upper branch, and a multiplier 1072 that multiplies by b on the lower branch only after the crossover branch 1074. This permits a multiplier 1076 to be used on the crossover branch 1074, multiplying by a, rather than by the fraction a/b. This will provide an equivalent result to the portion of the filter shown in FIG. 10A, though with an additional gain of b. Since the output of a filter is typically adjusted to compensate for gain in the filter, the additional gain can be compensated for at the output of the filter. Typically this overall compensation for filter gain is accomplished by dividing the output by a power of two, which is computationally inexpensive.

One type of polyphase filter that may advantageously be exponentiated in accordance with an embodiment is a bridge wave filter including two polyphase components, each of which is an allpass filter. An allpass filter is a type of IIR filter that passes all frequencies equally, but that may alter the phase of the signal. The transfer function for such a bridge wave filter for use as a halfband filter can be expressed as:

$$H(z) = \frac{\alpha + z^{-2}}{1 + \alpha z^{-2}} + z^{-1} \frac{\beta + z^{-2}}{1 + \beta z^{-2}}. \quad \text{Eq. 26}$$

Decomposing this into two polyphase components, for use in a filter structure such as is shown in FIG. 4 yields:

$$A = \frac{\alpha + z^{-2}}{1 + \alpha z^{-2}} \quad \text{Eq. 27}$$

$$B = \frac{\beta + z^{-2}}{1 + \beta z^{-2}}$$

Where $\alpha$ and $\beta$ are filter coefficients.

Figure 11:
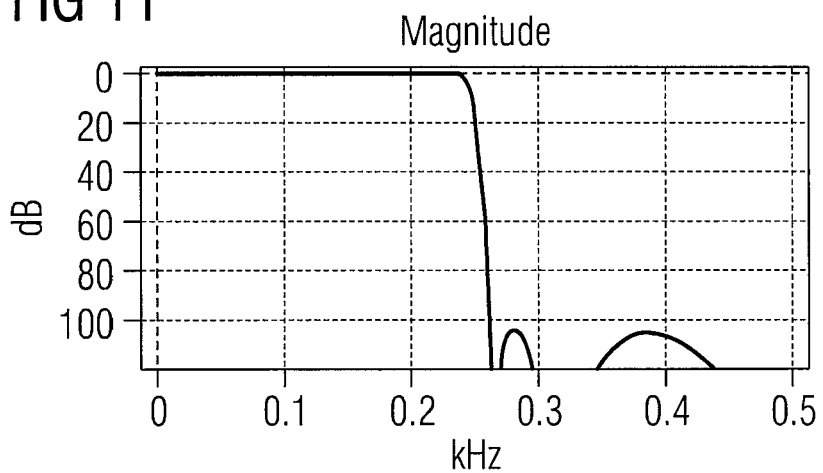
FIG. 11 shows the frequency response of an exponentiated polyphase digital filter constructed according to the principles of an embodiment.

In one embodiment of a filter, values of $\alpha$ and $\beta$ are set to ⅞ and ⁷⁄₁₆, respectively. Multiplication by these coefficients is computationally inexpensive, and can be accomplished by a small number of bit shifting and addition or subtraction operations. Using exponentiation to raise this polyphase filter to the 5$^{th}$ power provides a filter having a stopband attenuation of more than 100 dB, and a narrow transition band, with 15 dB attenuation at fs/4 (where fs is the sampling frequency). The frequency response of this filter is shown in FIG. 11.

By comparison, a conventionally designed bridge wave filter with this stopband attenuation uses the products of 11 allpass filters of the type shown above, with 18-bit coefficients, to provide the polyphase components for use in a filter having a structure such as is shown in FIG. 4. The polyphase components for this example of a conventionally designed filter are:

$$A = \frac{\left(\frac{14515}{131072} + z^{-2}\right)\left(\frac{23605}{65536} + z^{-2}\right)\left(\frac{159779}{262144} + z^{-2}\right)}{\left(1 + \frac{14515}{131072}z^{-2}\right)\left(1 + \frac{23605}{65536}z^{-2}\right)\left(1 + \frac{159779}{262144}z^{-2}\right)} \cdot \frac{\left(\frac{208217}{262144} + z^{-2}\right)\left(\frac{241581}{262144} + z^{-2}\right)}{\left(1 + \frac{208217}{262144}z^{-2}\right)\left(1 + \frac{241581}{262144}z^{-2}\right)}$$

$$B = \frac{\left(\frac{1921}{65536} + z^{-2}\right)\left(\frac{59689}{262144} + z^{-2}\right)}{\left(1 + \frac{1921}{65536}z^{-2}\right)\left(1 + \frac{59689}{262144}z^{-2}\right)} \cdot \frac{\left(\frac{14143}{16384} + z^{-2}\right)}{\left(1 + \frac{14143}{16384}z^{-2}\right)} \cdot \frac{\left(\frac{64371}{131072} + z^{-2}\right)\left(\frac{93141}{131072} + z^{-2}\right)}{\left(1 + \frac{64371}{131072}z^{-2}\right)\left(1 + \frac{93141}{131072}z^{-2}\right)} \cdot \frac{\left(\frac{255371}{262144} + z^{-2}\right)}{\left(1 + \frac{255371}{262144}z^{-2}\right)}$$

Figure 12:
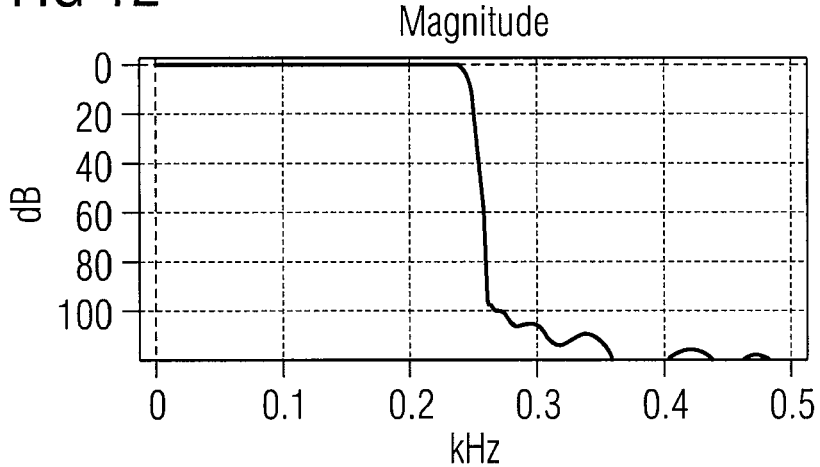
FIG. 12 shows the frequency response of a conventional polyphase digital filter.

The frequency response of this filter is shown in FIG. 12. While the stopband attenuation is similar to that of the filter designed in accordance with an embodiment, the attenuation at fs/4 is only 3 dB (instead of 15 dB), which increases the likelihood of audible alias distortions if, for example, this filter were used for audio applications.

Although the denominators in these expressions are all powers of two, permitting the necessary divisions to be done using bit shifting operations, it should be apparent that computing these values may require a greater amount of computation than computing the result of the exponentiated polyphase filter in accordance with an embodiment, as described above. Specifically, it has been determined that the conventionally designed filter may require 62 addition operations for the coefficients, and an additional 33 addition operations for the adders required in the expressions shown above, for a total of 95 addition operations. By contrast, the exponentiated polyphase filter, constructed in accordance with an embodiment, uses only 3 additions for each A-filter block and B-filter block, of which there are a total of 10 (5 of each), yielding 30 addition operations. Additionally 5 addition operations would be used for the coefficients, and 6 addition operations for the crossover paths. This gives a total of 41 addition operations—less than half of the total for the conventionally designed filter shown above.

Figure 13:
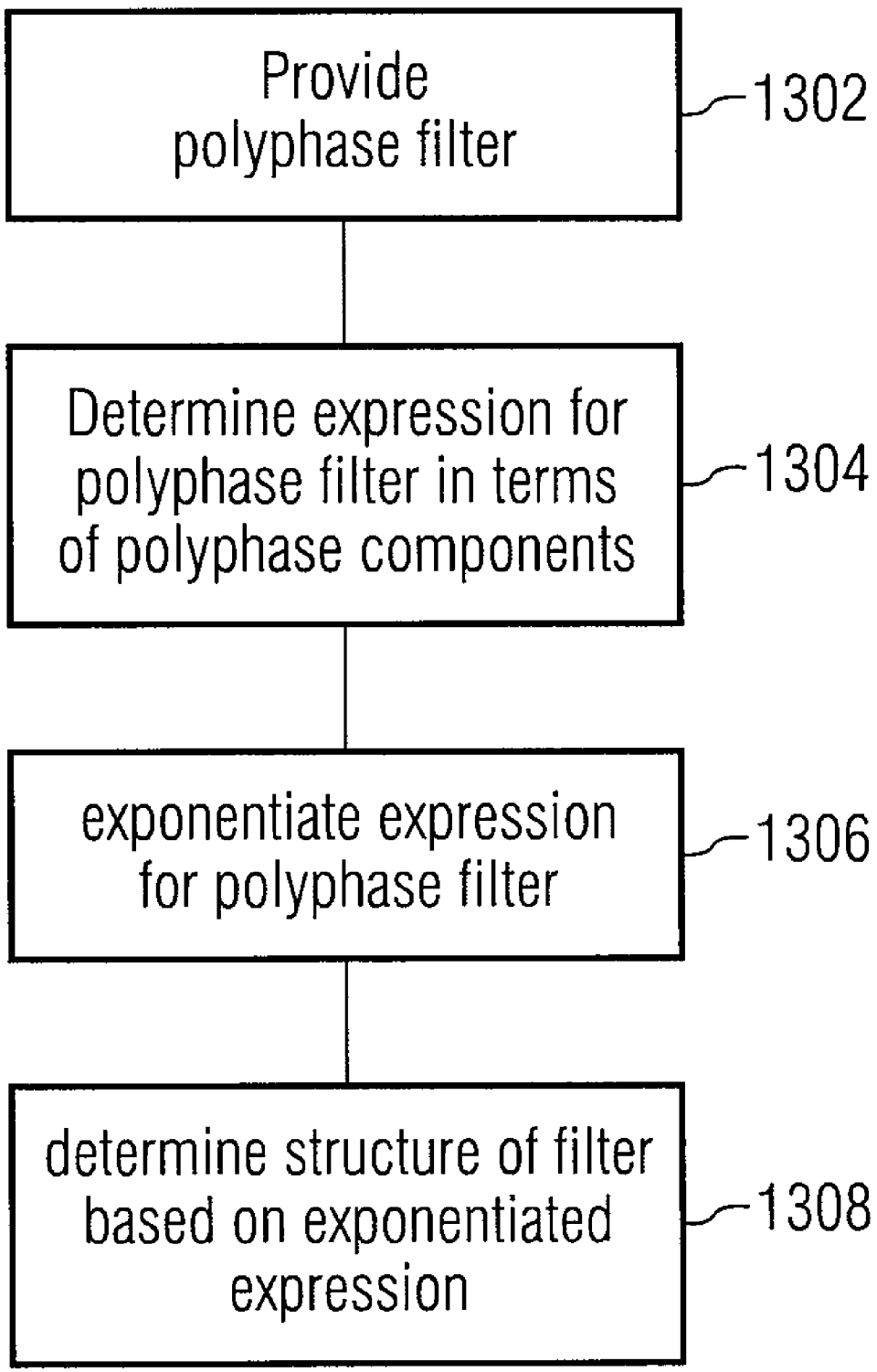
FIG. 13 shows a block diagram of a method for providing an exponentiated polyphase digital filter in accordance with an embodiment.

FIG. 13 shows a block diagram of a general method for providing an exponentiated polyphase digital filter in accordance with an embodiment. In step 1302, a polyphase filter having two or more polyphase components is provided. In step 1304, an expression for the polyphase filter is determined in terms of the polyphase components. In step 1306, the expression is exponentiated by raising it to a power P, to provide an expression for an exponentiated polyphase filter. In step 1308, this exponentiated expression is used to derive a structure for arranging the polyphase components of the exponentiated polyphase digital filter. This structure may be made more efficient through the use of crossover paths, to share some of the filter blocks among multiple signal paths through the filter. If N=2, then one of the canonical or near-canonical structures, described above with reference to FIGS. 9A and 9B may be used.

In summary, in one embodiment, a method for providing a digital filter includes providing a polyphase digital filter that includes at least two polyphase components, determining an expression for the polyphase digital filter in terms of the polyphase components, raising the expression for the polyphase digital filter to a power to provide an exponentiated expression, and providing an exponentiated polyphase digital filter wherein the polyphase components are arranged in a structure based on the exponentiated expression. In some embodiments, the digital filter may be configured for decimation, while in others, it may be configured for interpolation.

In some embodiments, providing an exponentiated polyphase digital filter may include optimizing the structure, so that an application of at least one of the polyphase components is shared by at least two signal paths in the exponentiated polyphase digital filter. In some embodiments, this may be accomplished using a crossover path in the structure of the exponentiated polyphase digital filter. In certain embodiments, optimizing the structure may include providing a canonical structure for the exponentiated polyphase digital filter.

In some embodiments, optimizing the structure may include using one or more repetitions of a repeatable filter section in the structure. Each repetition of the repeatable filter section may represent raising the power of the polyphase digital filter by at least two. In some embodiments, each repetition of the repeatable filter section uses an exponentiation coefficient that varies with each repetition. In some embodiments, the power to which the filter is raised is odd, and using an exponentiation coefficient includes calculating the exponentiation coefficient according to:

$$k_i = \frac{N}{2i-1}$$

where N is the power to which the polyphase digital filter is raised; i is the repetition of the repeatable filter section, and ranges from 1 to (N-1)/2; and $k_i$ is the exponentiation coefficient for the $i^{th}$ repetition of the repeatable filter section.

In some embodiments, the power to which the filter is raised is even, and using an exponentiation coefficient includes calculating the exponentiation coefficient according to:

$$k_i = \begin{cases} N & i = 0 \\ \frac{(N-1)(N+1)}{(2i-1)(2i+1)} & i = 1 \ldots \frac{N}{2} - 1 \end{cases}$$

where N is the power to which the polyphase digital filter is raised; i is the repetition of the repeatable filter section, and ranges from 0 to N/2−1; and $k_i$ is the exponentiation coefficient for the $i^{th}$ repetition of the repeatable filter section, with $k_0$ representing a coefficient that is used outside of the repeatable filter section.

In another embodiment, a digital filter is provided that includes numerous A-filter blocks, wherein each A-filter block applies a first polyphase component of a polyphase filter to an input signal. The filter also includes numerous B-filter blocks, each B-filter block applying a second polyphase component of the polyphase filter to the input signal. The digital filter further includes at least one delay element that delays the input signal by one or more sample times. The A-filter blocks, B-filter blocks, and the delay element are interconnected in a structure that represents exponentiation of the polyphase filter by a power. In some embodiments, the digital filter may include one or more repetitions of a repeatable filter section. In some embodiments, each repetition of the repeatable filter section includes a multiplication by an exponentiation coefficient that varies with the repetition of the repeatable filter section.

In some embodiments, the structure includes a first parallel branch and a second parallel branch, wherein an A-filter block is disposed on the first parallel branch, and a B-filter block is disposed on the second parallel branch. Some of these embodiments may include a crossover path that connects the first parallel branch and the second parallel branch to form a signal path that includes at least a portion of the first parallel branch and at least a portion of the second parallel branch. In some embodiments, the crossover path includes a multiplier, that multiplies a signal on the signal path that includes the crossover path by a coefficient. In certain embodiments, the first parallel branch and the second parallel branch operate at a rate that is slower than the rate of an input to the digital filter by at least a factor of two, while in some embodiments the first parallel branch and the second parallel branch operate at a rate that is slower than the rate of an output of the digital filter by at least a factor of two.

In some embodiments, the polyphase filter comprises an infinite impulse response filter. For some of these embodiments, the first polyphase component includes an allpass filter and the second polyphase component includes an allpass filter. In other embodiments, the polyphase filter may include a finite impulse response filter.

In some embodiments, the digital filter includes a programmable digital signal processor that is programmed to implement the structure. In other embodiments, the digital filter includes a programmable general purpose processor that is programmed to implement the structure. In yet other embodiments, the digital filter includes special-purpose electronics that implement the structure.

In another embodiment, a digital filter is provided that includes first filtering means for applying a first polyphase component of a polyphase filter to an input signal, second filtering means for applying a second polyphase component of the polyphase filter to the input signal, delay means for delaying the input signal by one or more sample times, and interconnection means for interconnecting the first filtering means, the second filtering means, and the delay means in a structure that represents exponentiation of the polyphase filter by a power. In some embodiments, the interconnection means includes a first parallel branch that includes an instance of the first filtering means, a second parallel branch that includes an instance of the second filtering means, and crossover means for forming a signal path in the digital filter that includes at least a portion of the first parallel branch and at least a portion of the second parallel branch.

In another embodiment, a method is provided of transforming a digital input signal, including applying numerous instances of a first polyphase component of a polyphase digital filter to the digital input signal, applying numerous instances of a second polyphase component of the polyphase digital filter to the digital input signal, and applying numerous delays to the digital input signal. The instances of the first polyphase component, the instances of the second polyphase component, and the delays are applied to the signal according to a structure representing exponentiation of the polyphase digital filter by a power of at least two.

In yet another embodiment, a digital filter is provided that includes numerous instances of a first allpass digital filter, numerous instances of a second allpass digital filter, and numerous delay elements. The instances of the first allpass digital filter, the instances of the second allpass digital filter, and the delay elements are arranged in a structure representing exponentiation by a power of at least two of a polyphase digital filter having the first allpass digital filter and the second allpass digital filter as polyphase components. In some embodiments, the structure includes at least one repetition of a repeatable filter section, each repetition of the repeatable filter section representing raising the power of the exponentiation of the polyphase digital filter by at least two. In some embodiments, the power of the exponentiation is determined by the desired characteristics of the digital filter. In some such embodiments, the first allpass digital filter, the second allpass digital filter, and the power of the exponentiation are selected to provide a digital filter having a stop band attenuation of at least 100 dB, with an attenuation greater than 3 dB at one fourth of a sampling frequency of the digital filter.

While the invention has been shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes that come within the meaning and range of equivalency of the claims are intended to be embraced.

What is claimed is:

1. A method of forming a polyphase digital filter comprising:
   arranging a first polyphase component filter in a filter structure between an input and an output of a polyphase digital filter; and
   arranging a second polyphase component filter in the filter structure of the polyphase digital filter, wherein the first and second polyphase component filters are interconnected in the filter structure of the polyphase digital filter based on exponentiated expression comprising an expression for the polyphase digital filter, in terms of first and second polyphase components, raised to a power, such that the polyphase digital filter is formed as an exponentiated polyphase digital filter.

2. The method of claim 1, wherein the filter structure is formed to be optimized such that an application of at least one of the first and second polyphase components is shared by at least two signal paths in the exponentiated polyphase digital filter.

3. The method of claim 2, wherein the filter structure is formed with a crossover path.

4. The method of claim 2, wherein the filter structure is formed to include a canonical structure for the exponentiated polyphase digital filter.

5. The method of claim 2, wherein the filter structure is formed to include one or more repetitions of a repeatable filter section.

6. The method of claim 5, wherein the one or more repetitions of the repeatable filter section are formed to raise the power of the polyphase digital filter by at least two for each repetition of the repeatable filter section.

7. The method of claim 5, wherein the one or more repetitions of the repeatable filter section are formed to implement an exponentiation coefficient that varies with each repetition of the repeatable filter section.

8. The method of claim 7, wherein the power to which the polyphase digital filter is raised is odd, and wherein the exponentiation coefficient is implemented according to:

$$k_i = \frac{N}{2i-1}$$

where N is the power to which the polyphase digital filter is raised;
i is the repetition of the repeatable filter section, and ranges from 1 to (N-1)/2; and
$k_i$ is the exponentiation coefficient for the $i^{th}$ repetition of the repeatable filter section.

9. The method of claim 7, wherein the power to which the polyphase digital filter is raised is even, and wherein the exponentiation coefficient is implemented according to:

$$k_i = \begin{cases} N & i = 0 \\ \frac{(N-1)(N+1)}{(2i-1)(2i+1)} & i = 1 \ldots \frac{N}{2}-1 \end{cases}$$

where N is the power to which the polyphase digital filter is raised;
i is the repetition of the repeatable filter section, and ranges from 0 to N/2-1; and
$k_i$ is the exponentiation coefficient for the $i^{th}$ repetition of the repeatable filter section, with $k_0$ representing a coefficient that is used outside of the repeatable filter section.

10. The method of claim 1, wherein the polyphase digital filter is formed to implement decimation.

11. The method of claim 1, wherein the polyphase digital filter is formed to implement interpolation.

12. A digital filter comprising:
a plurality of A-filter blocks, each A-filter block applying a first polyphase component of a polyphase filter to an input signal;
a plurality of B-filter blocks, each B-filter block applying a second polyphase component of the polyphase filter to the input signal; and a delay element that delays the input signal by one or more sample times, wherein the plurality of A-filter blocks, the plurality of B-filter blocks, and the delay element are interconnected in a structure that represents exponentiation of the polyphase filter by a power.

13. The digital filter of claim 12, wherein the structure comprises a first parallel branch and a second parallel branch, and wherein an A-filter block is disposed on the first parallel branch, and a B-filter block is disposed on the second parallel branch.

14. The digital filter of claim 13, wherein the structure further comprises a crossover path that connects the first parallel branch and the second parallel branch to form a signal path that comprises at least a portion of the first parallel branch and at least a portion of the second parallel branch.

15. The digital filter of claim 14, wherein the crossover path comprises a multiplier that multiplies a signal on the signal path that includes the crossover path by a coefficient.

16. The digital filter of claim 13, wherein the first parallel branch and the second parallel branch operate at a rate that is slower than the rate of an input to the digital filter by at least a factor of two.

17. The digital filter of claim 13, wherein the first parallel branch and the second parallel branch operate at a rate that is slower than the rate of an output of the digital filter by at least a factor of two.

18. The digital filter of claim 12, wherein the digital filter comprises one or more repetitions of a repeatable filter section.

19. The digital filter of claim 18, wherein each repetition of the repeatable filter section comprises a multiplication by an exponentiation coefficient that varies with the repetition of the repeatable filter section.

20. The digital filter of claim 19, wherein the power to which the digital filter is raised is odd, and wherein the exponentiation coefficient for each repetition of the repeatable filter section is calculated according to:

$$k_i = \frac{N}{2i-1}$$

where N is the power to which the digital filter is raised;
i is the repetition of the repeatable filter section, and ranges from 1 to (N-1)/2; and
$k_i$ is the exponentiation coefficient for the $i^{th}$ repetition of the repeatable filter section.

21. The digital filter of claim 19, wherein the power to which the digital filter is raised is even, and wherein the exponentiation coefficient for each repetition of the repeatable filter section is calculated according to:

$$k_i = \begin{cases} N & i=0 \\ \frac{(N-1)(N+1)}{(2i-1)(2i+1)} & i=1\ldots\frac{N}{2}-1 \end{cases}$$

where N is the power to which the digital filter is raised;
i is the repetition of the repeatable filter section, and ranges from 0 to N/2-1; and
$k_i$ is the exponentiation coefficient for the $i^{th}$ repetition of the repeatable filter section, with $k_0$ representing an exponentiation coefficient that is used outside of the repeatable filter section.

22. The digital filter of claim 12, wherein the polyphase filter comprises an infinite impulse response filter.

23. The digital filter of claim 22, wherein the first polyphase component comprises an allpass filter and the second polyphase component comprises an allpass filter.

24. The digital filter of claim 12, wherein the polyphase filter comprises a finite impulse response filter.

25. The digital filter of claim 12, wherein the digital filter comprises a programmable digital signal processor that is programmed to implement the structure.

26. The digital filter of claim 12, wherein the digital filter comprises a programmable general purpose processor that is programmed to implement the structure.

27. The digital filter of claim 12, wherein the digital filter comprises special-purpose electronics that implement the structure.

28. A digital filter comprising:
first filtering means for applying a first polyphase component of a polyphase filter to an input signal;
second filtering means for applying a second polyphase component of the polyphase filter to the input signal;
delay means for delaying the input signal by one or more sample times; and
interconnection means for interconnecting the first filtering means, the second filtering means, and the delay means in a structure that represents exponentiation of the polyphase filter by a power.

29. The digital filter of claim 28, wherein the interconnection means further comprises:
a first parallel branch, comprising an instance of the first filtering means;
a second parallel branch, comprising an instance of the second filtering means; and
crossover means for forming a signal path in the digital filter that comprises at least a portion of the first parallel branch and at least a portion of the second parallel branch.

30. A method of transforming a digital input signal, the method comprising:
applying, in a polyphase digital filter, a plurality of instances of a first polyphase component of the polyphase digital filter to the digital input signal;
applying, in the polyphase digital filter, a plurality of instances of a second polyphase component of the polyphase digital filter to the digital input signal; and
applying, in the polyphase digital filter, a plurality of delays to the digital input signal;
wherein the instances of the first polyphase component, the instances of the second polyphase component, and the delays are applied to the signal according to a structure representing exponentiation of the polyphase digital filter by a power of at least two.

31. A digital filter comprising:
a plurality of instances of a first allpass digital filter;
a plurality of instances of a second allpass digital filter; and
a plurality of delay elements;
wherein the instances of the first allpass digital filter, the instances of the second allpass digital filter, and the delay elements are arranged in a structure representing exponentiation by a power of at least two of a polyphase digital filter having the first allpass digital filter and the second allpass digital filter as polyphase components.

32. The digital filter of claim 31, wherein the structure comprises at least one repetition of a repeatable filter section, each repetition of the repeatable filter section representing raising the power of the exponentiation of the polyphase digital filter by at least two.

33. The digital filter of claim 31, wherein the power of the exponentiation is determined by the desired characteristics of the digital filter.

34. The digital filter of claim 33, wherein the first allpass digital filter, the second allpass digital filter, and the power of the exponentiation are selected to provide a digital filter having a stop band attenuation of at least 100 dB, with an attenuation greater than 3 dB at one fourth of a sampling frequency of the digital filter.

* * * * *